(12) United States Patent
Pendharkar

(10) Patent No.: US 8,110,454 B2
(45) Date of Patent: Feb. 7, 2012

(54) METHODS OF FORMING DRAIN EXTENDED TRANSISTORS

(75) Inventor: Sameer P. Pendharkar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 153 days.

(21) Appl. No.: 12/552,471

(22) Filed: Sep. 2, 2009

(65) Prior Publication Data

US 2009/0325352 A1 Dec. 31, 2009

Related U.S. Application Data

(62) Division of application No. 11/408,692, filed on Apr. 20, 2006, now Pat. No. 7,602,019.

(51) Int. Cl.
*H01L 29/72* (2006.01)

(52) U.S. Cl. ........ 438/163; 438/233; 438/266; 438/286; 438/532

(58) Field of Classification Search ................. 438/163, 438/233, 266, 286, 532
See application file for complete search history.

(56) References Cited

U.S. PATENT DOCUMENTS

| 6,313,696 | B1 | 11/2001 | Zhang |
| 7,333,351 | B2 | 2/2008 | Disney |
| 2002/0043670 | A1* | 4/2002 | Zehnich ............... 257/207 |

* cited by examiner

*Primary Examiner* — Edward Wojciechowicz
(74) *Attorney, Agent, or Firm* — Warren L. Franz; Wade J. Brady, III; Frederick J. Telecky, Jr.

(57) ABSTRACT

A transistor comprises a source region of a first conductivity type and electrically communicating with a first semiconductor region. The transistor also comprises a drain region of the first conductivity type and electrically communicating with a second semiconductor region that differs from the first semiconductor region. An interface exists between the first semiconductor region and the second semiconductor region. The transistor also comprises a voltage tap region comprising at least a portion located in a position that is closer to the interface than the drain region. A mixed technology circuit is also described.

15 Claims, 3 Drawing Sheets

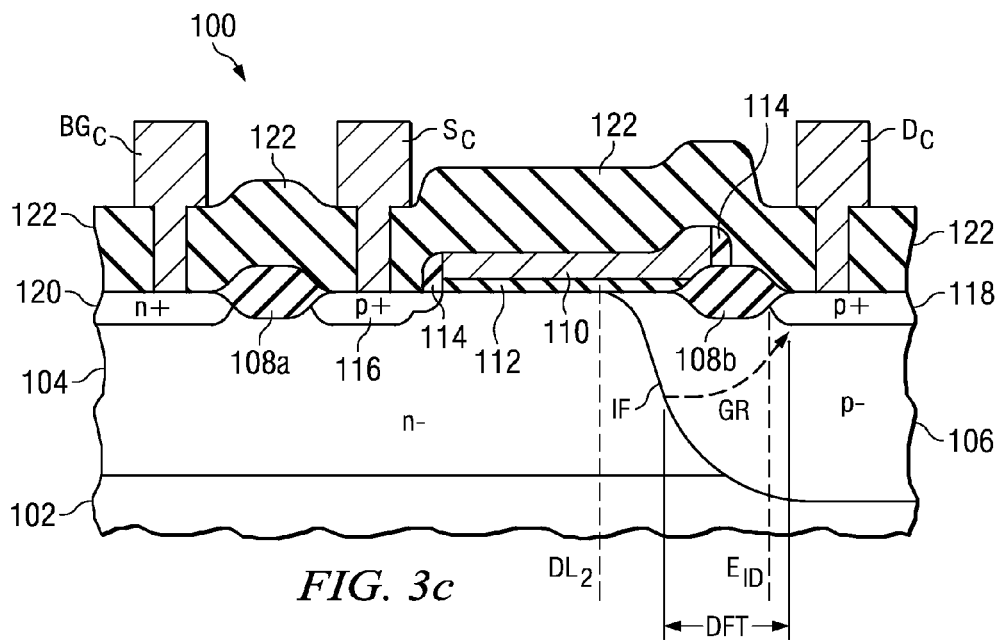
*FIG. 3c*
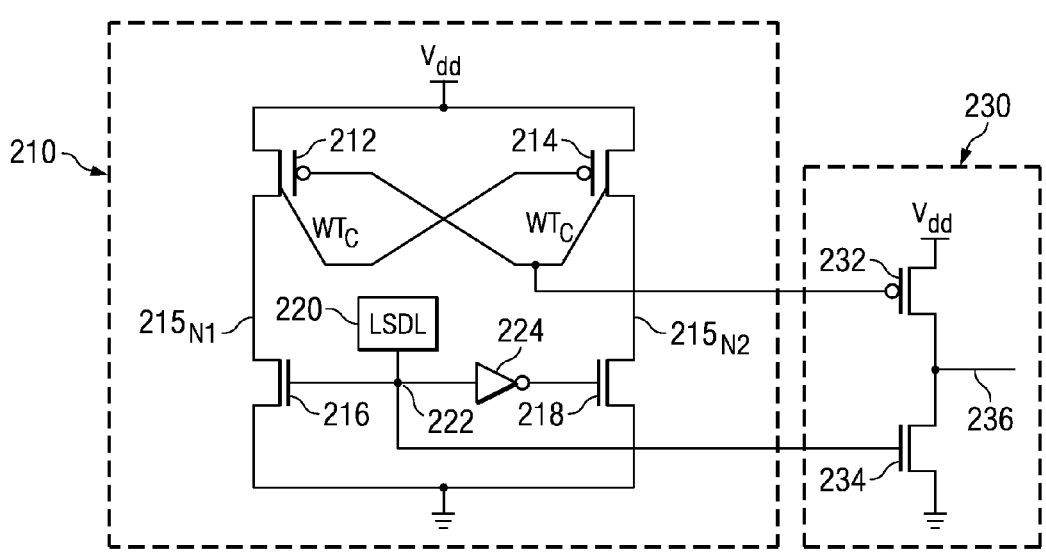
*FIG. 4a*
*FIG. 4b*

METHODS OF FORMING DRAIN EXTENDED TRANSISTORS

This is a division of U.S. application Ser. No. 11/408,692, filed Apr. 20, 2006, the entirety of which is incorporated herein by reference.

BACKGROUND

The present embodiments relate to semiconductor circuits and are more particularly directed to transistors, such as drain extended transistors, and methods of forming the same.

Semiconductor devices are prevalent in all aspects of electronic circuits, and such circuits sometimes include so-called mixed signal technology that uses both analog devices (e.g., amplifiers) and digital devices (e.g., logic circuits). In mixed signal technology, typically the voltage supply used by the analog devices is higher than that used by the digital devices, where the voltage supply used by the digital devices is sometimes referred to as the core voltage. As a result, some type of voltage level shifting is implemented to couple the two different circuits to supply or to trigger one circuit (e.g., analog) based on an input level of the other circuit (e.g., digital). In the prior art, such level shifting is typically achieved by either using a dual gate oxide process in a gate drive configuration as detailed below, or it may be achieved by using several drain extended transistors in a so-called cascode configuration. Both of these techniques have additional costs associated with them.

By way of further background to the preceding, FIG. 1 illustrates a schematic of a prior art drive circuit 10 that is implemented in a mixed technology system and using a dual gate oxide process, where the process is so named because some transistors in the system have one gate oxide thickness while other transistors in the same system have a different gate oxide thickness; hence, there are "dual" thicknesses. Looking to circuit 10 in detail, it includes a gate drive stage 20 and an inverter stage 40. Gate drive stage 20 includes a p-channel transistor 22 cross-coupled to a p-channel transistor 24 in that the source of both of transistors 22 and 24 is connected to $V_{dd}$ and the gate of each of p-channel transistors 22 and 24 is connected to the drain of the opposing p-channel transistor. Note that the value of $V_{dd}$ is that from the analog portion of the mixed technology system and, thus, may be quite high as compared to the voltage supply of the digital portion or core, referred to herein as $V_{DDC}$. For example, in contemporary devices, $V_{dd}$ may be in the range of 20 to 80 volts while $V_{DDC}$ may be in the range of 1 to 5 volts. Continuing with the circuit connectivity, the drain of p-channel transistor 22 is connected to a node $20_{N1}$ which is also connected to the drain of an n-channel transistor 26, and the source of n-channel transistor 26 is connected to ground. Comparably, the drain of p-channel transistor 24 is connected to a node $20_{N2}$ which is also connected to the drain of an n-channel transistor 28, and the source of n-channel transistor 28 is connected to ground. A low side drive logic block 30 provides a signal to an input node 32 which is connected to the gate of n-channel transistor 26 and through an inverter 34 to the gate of n-channel transistor 28. Looking to inverter stage 40, it includes a p-channel transistor 42 having its source connected to $V_{dd}$, its drain connected to an output node 44, and its gate connected to node $20_{N2}$ (i.e., the drains of p-channel transistor 24 and n-channel transistor 28). Inverter stage 40 also includes an n-channel transistor 46 having its source connected to ground, its drain connected to output node 44, and its gate connected to input node 32. Lastly, note that p-channel transistors 22, 24, and 42 are all formed with relatively thick gate oxides, such as on the order of 500 to 1,000 Angstroms thick. N-channel transistors 26, 28, and 46, however, may have thinner gate oxides, such as on the order of 40 to 200 Angstroms thick. Thus, a dual gate oxide process is implemented so as to accommodate both the thick and thin gate oxides, where the former are required for reasons better understood below.

The general operation of drive circuit 10 will be readily appreciated by one skilled in the art, but is described briefly here so as to focus on certain aspects for contrast to the preferred embodiments detailed later. In general, a data state at input node 32 causes a complementary data state at output node 44. As a first example of operation, if a ground voltage is applied by block 30 to input node 32, then n-channel transistors 26 and 46 are disabled, while inverter 34 outputs a voltage of $V_{DDC}$ because n-channel transistors 26, 28, and 46 may operate at the core voltage levels as are also provided by low side drive logic block 30. Thus, the voltage of $V_{DDC}$ is applied to the gate of n-channel transistor 28, thereby enabling it and thus connecting node $20_{N2}$ to ground. The ground potential at node $20_{N2}$ is connected to the gate of p-channel transistor 42, thereby enabling it and bringing output node 44 to $V_{dd}$. At the same time, the ground potential at node $20_{N2}$ is connected to the gate of p-channel transistor 22, thereby enabling it and bringing node $20_{N1}$ to $V_{dd}$. The $V_{dd}$ at node $20_{N1}$ is connected to the gate of p-channel transistor 24, thereby maintaining it in a disabled state. From the preceding, therefore, an overall function of circuit 10 is that a ground voltage at input node 32 causes a voltage of $V_{dd}$ at output node 44. One skilled in the art may readily appreciate the complementary operation as well, that is, a voltage of $V_{DDC}$ at input node 32 causes a ground voltage at output node 44.

With an understanding of the preceding, a drawback of circuit 10 may be appreciated in that the circuit necessitates the use of thick gate oxide p-channel transistors. Specifically, note in the first example of operation above that p-channel transistor 22 is enabled. As a result, it has $V_{dd}$ at its source and conducts that to its drain, while at the same time it has a ground potential at its gate. Thus, since $V_{dd}$ is relatively large in this example (as compared to the digital core logic supply voltage), then a large voltage difference exists as between this same voltage in the channel of the transistor and the ground voltage at its gate. As known in the art, such a large voltage may cause a breakdown of the device, particularly in the areas where the source or drain diffused regions are near the gate sidewalls. To avoid such a breakdown, the above-introduced thicker gate oxide is used in this transistor, and for similar reasons it is also used in p-channel transistors 24 and 42. At the same time, n-channel transistors 26, 28, and 46 do not necessitate a thick gate oxide and, hence, they are constructed using a thinner gate oxide. Accordingly, there is a dual gate oxide process required in that one thickness is sufficient for the n-channel transistors while another in this configuration is necessitated for the p-channel transistors. This process provides added expense and complexity, and as is well-known in the art these additions in device fabrication are unfavorable if they may be satisfactorily avoided.

By way of further background, another technique used with mixed signal technology is the cascoding of so-called drain extended MOS ("DEMOS") transistors, where a single one of such transistors is now introduced in connection with FIGS. 2a and 2b. Specifically, FIG. 2a illustrates a cross-sectional view, and FIG. 2b illustrates a plan view, of a prior art DEMOS transistor 50. Transistor 50 is a p-channel DEMOS device, formed at a surface of typically lightly-doped semiconductor substrate 52. This example structure, as typical in the art for integrated circuits constructed according to complementary MOS (CMOS) technology, is formed according to a conventional twin-well process, in which an n-type well region 54 and a p-type well region 56 are formed at the surface of substrate 52. Both in the illustrated location and elsewhere in the integrated circuit, wells 54 and 56 serve as the body region for p-channel MOS and n-channel MOS transistors, respectively, and as such are typically relatively lightly doped. Field oxide structures 58a and 58b are formed and isolate conductive regions from one another. Although not shown, doped regions may be disposed beneath field oxide structures 58a and 58b to serve as so-called "channel stops" to enhance the isolation provided by field oxide regions 58a and 58b.

Turning to the active portions of DEMOS transistor 50, they are formed by self-aligned ion implantation at the surface of wells 54 and 56. In this example, a gate electrode 60 is a patterned layer of polysilicon, metal, silicide-clad polysilicon, or another known conductive material suitable for use as a transistor gate, and disposed over a gate oxide layer 61. Sidewall insulating regions may be disposed along the edges of gate electrode 60. A source region 62 is a heavily-doped p-type region that is formed by ion implantation in a self-aligned manner relative to gate electrode 60 and field oxide structure 58a at the surface of n-well 54. Further, a drain region 64 is a heavily doped p-type region formed by ion implantation into the surface of p-well 56, self-aligned relative to field oxide structure 58b and preferably using the same implant or implants used to form source region 62. A backgate contact region 66 is a heavily-doped n-type region formed at a selected location of n-well 54.

Completing the remaining structure of transistor 50, an overlying insulator layer 68 is disposed over all of the above-described underlying structures, including gate electrode 60, field oxide structures 58a and 58b, and source, drain, and backgate contact regions 62, 64, and 66, respectively. Contact openings are etched through insulator layer 68 at selected locations, and metal is then located within the openings and etched to form $BG_C$ ("backgate"), $S_C$ (Sc"source"), and $D_C$ ("drain") conductors, as shown in FIGS. 2a and 2b. In addition, also shown in FIG. 2b (but not in FIG. 2a due to the location of the cross-section taken across FIG. 2b to provide FIG. 2a) is a gate conductor $G_C$ ("gate"), which extends downward to contact, for purposes of applying a potential to, gate electrode 60.

As mentioned above, transistor 50 of FIGS. 2a and 2b is a drain-extended device. This drain extension is implemented in part by field oxide structure 58b that is located to form drain region 64 as shown and onto which gate electrode 60 overlaps. Also in connection with the drain-extension aspects, and as shown in FIG. 2a, p-well 56 extends inwardly from and relative to drain region 64 toward the transistor channel and beyond field oxide structure 58b, and an interface IF exists between p-well 56 and n-well 54. For sake of later contrast, a dashed line $DL_1$ is shown in FIGS. 2a and 2b at the location where interface IF terminates under gate oxide 61. The operation and effect with respect to this extension is explored immediately below.

When transistor 50 is turned on by the application of a negative gate-to-source voltage, via gate conductor $G_C$ (and gate electrode 60) relative to source conductor $S_C$ (and source region 62), the majority carrier holes for the PMOS device are attracted to and thereby create an inversion channel in the n-type material of n-well 54 under gate oxide 61, where furthermore the holes conduct from source region 62 toward the lower voltage at drain region 64 along this inversion channel. Upon reaching interface IF, that is, upon encountering p-well 56, the inversion channel is no longer present, but the holes continue to drift toward drain region 64. As such, the portion of p-well 56 between drain region 64 and the channel region formed in n-well 54 is referred to as the "drift region" of the DEMOS device, and is shown in FIG. 2a as drift region DFT.

Consider now the case where source conductor $S_C$ (and source region 62) and gate conductor $G_C$ (and hence gate electrode 60) are connected to a relatively large $V_{dd}$ voltage, such as on the order of 50 volts, while drain conductor $D_C$ (and drain region 64) is connected to ground. In this instance, the gate-to-source voltage is zero and the gate voltage repels the p-type majority carrier holes away from the channel area beneath gate oxide 61, thereby preventing conduction between the source and drain regions of the device. At this same time, however, note that the voltage difference, between $V_{dd}$ at gate conductor $G_C$ and ground at drain conductor $D_C$, is considerable, given that $V_{dd}$ in this example is relatively large. As a result, in prior art devices without an extended drain region as is provided by p-well 56, this difference could cause a breakdown of gate oxide 61, particularly if drain region 64 were closely self-aligned, as it is in the prior art, to the edge of gate electrode 60. In contrast, however, in effect when transistor 50 is not conducting, p-well 56 causes a voltage gradient GR across the resistive body of that well, thereby reducing the effective difference of voltage between gate electrode 60 and the channel in the direction toward drain region 64. As a result, the chance of breakdown of gate oxide 61 is diminished.

Given the preceding, one skilled in the art will appreciate the construction and use for a DEMOS transistor, and recall further that above it was noted that such a device may be cascoded by using multiple ones of these devices in mixed signal applications, using therefore the cascoded devices to withstand the larger voltage swing from the analog voltage supply. While such an approach is acceptable in various applications, it has certain drawbacks, such as added complexity, larger overall circuit size, and cost increase.

In view of the above, there arises a need to address the drawbacks of the prior art, as is achieved by the preferred embodiments described below.

SUMMARY

In one preferred embodiment there is a transistor. The transistor comprises a source region of a first conductivity type and electrically communicating with a first semiconductor region, and the transistor also comprises a drain region of the first conductivity type and electrically communicating with a second semiconductor region that differs from the first semiconductor region. An interface exists between the first semiconductor region and the second semiconductor region. The transistor also comprises a voltage tap region comprising at least a portion located in a position that is closer to the interface than the drain region.

In another preferred embodiment, there is a mixed technology circuit, comprising a first stage comprising at least one transistor of a first conductivity type and at least one transistor of a second conductivity type. At least one of the transistor of the first conductivity type and the transistor of the second conductivity type has a gate for receiving an input voltage selected from a first voltage and a second voltage. Also, a first voltage difference exists between the first voltage and the second voltage. The first stage is coupled to receive bias voltages of a third voltage and a fourth voltage, with a second voltage difference existing between the third voltage and the fourth voltage. The second voltage difference is greater than the first voltage difference. The circuit also comprises a second stage responsive to the first stage and comprising an output responsive to the input voltage and for producing a resultant output signal. The transistor of the first conductivity type and the transistor of the second conductivity type both comprise a gate oxide of a same thickness.

Other aspects are also disclosed and claimed.

BRIEF DESCRIPTION OF THE DRAWING

FIG. 2b illustrates a plan view of the prior art DEMOS transistor shown in FIG. 2a.

FIG. 3c illustrates a plan view of the preferred embodiment DEMOS transistor shown in FIGS. 3a and 3b.

FIG. 4a illustrates a schematic of the preferred embodiment DEMOS transistor shown in FIGS. 3a, 3b, and 3c.

FIG. 4b illustrates a schematic of an example of a preferred embodiment drive circuit using a preferred embodiment DEMOS transistor.

DETAILED DESCRIPTION OF THE INVENTION

Figure 1:
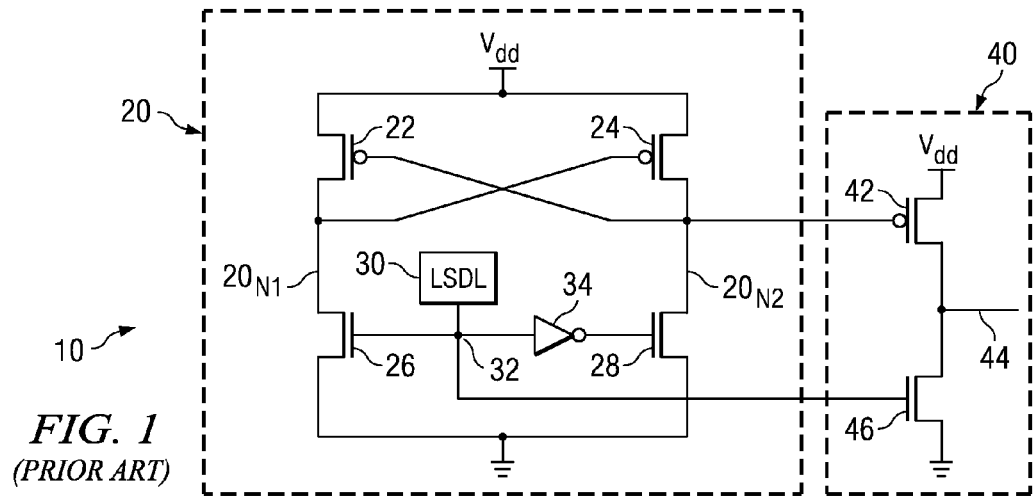
FIG. 1 illustrates a schematic of a prior art drive circuit that is implemented in a mixed technology system using a dual gate oxide process.
Figure 2A:
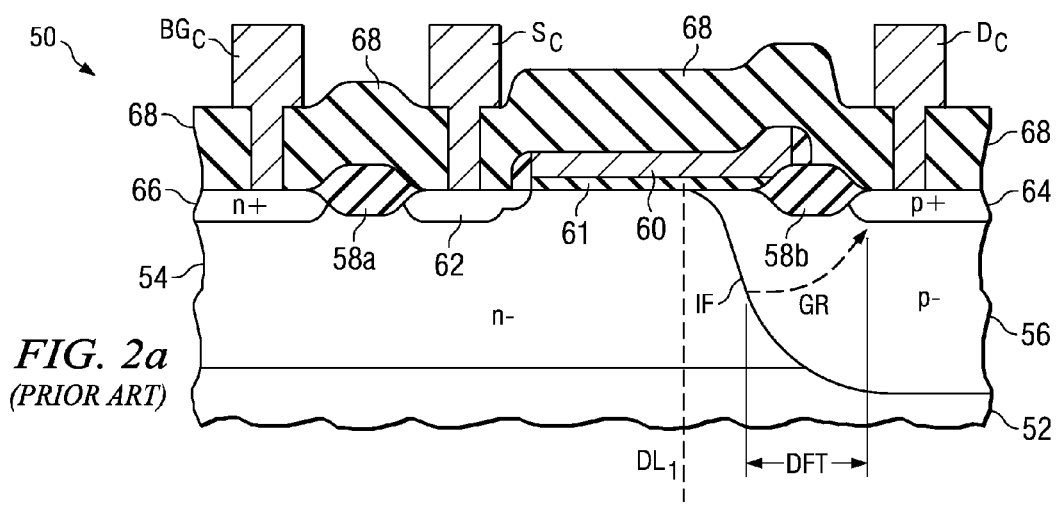
FIG. 2a illustrates a cross-sectional view of a prior art DEMOS transistor.
Figure 2B:
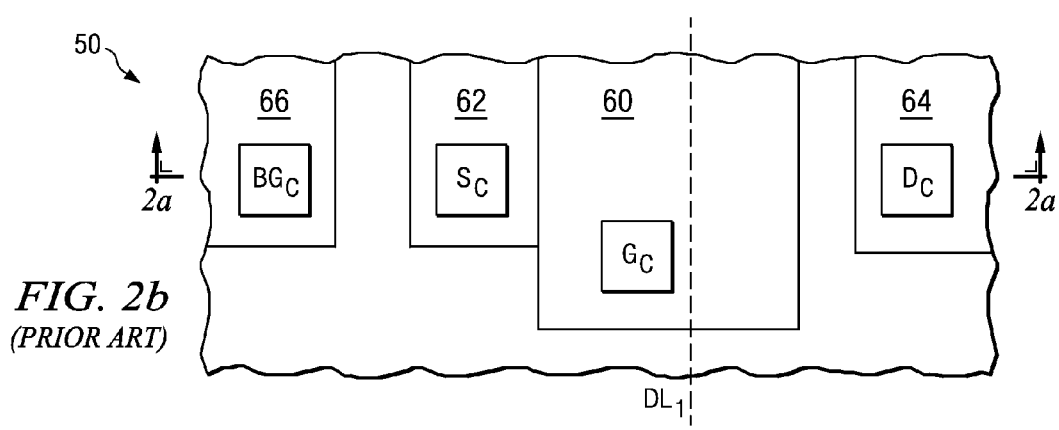

FIGS. 1, 2a, and 2b were discussed above in the Background section of this document and the reader is assumed familiar with the principles of that discussion.

Figure 3A:
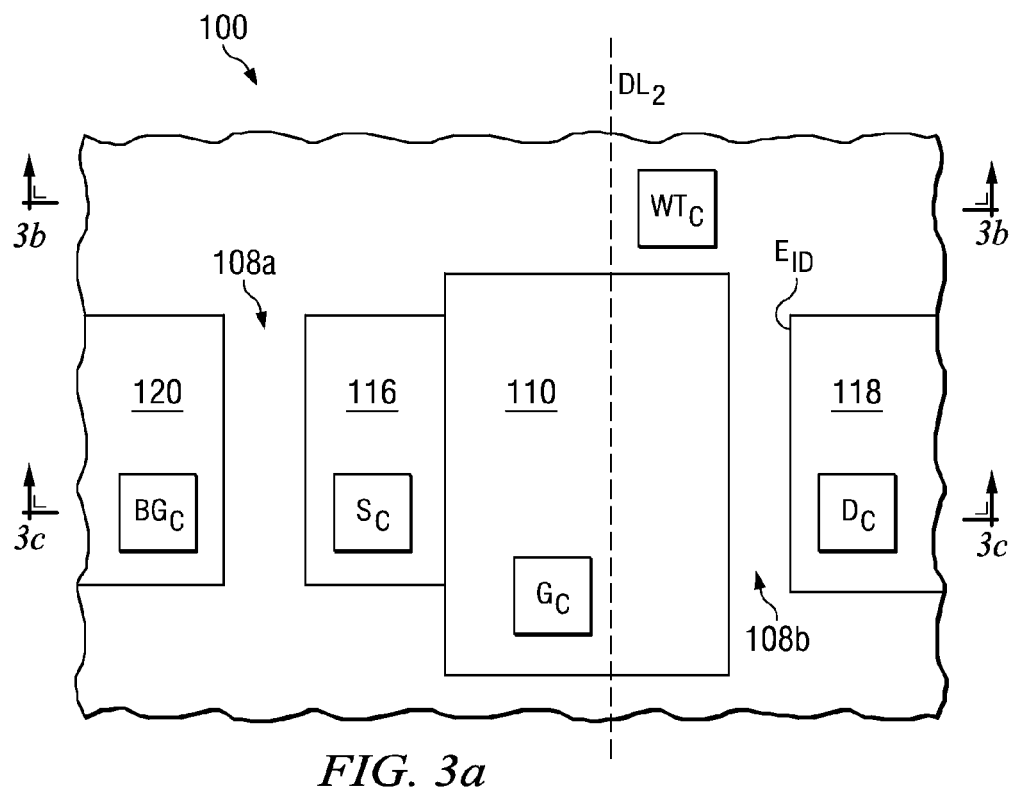
FIG. 3a illustrates a first cross-sectional view of a DEMOS transistor per a preferred embodiment.
Figure 3B:
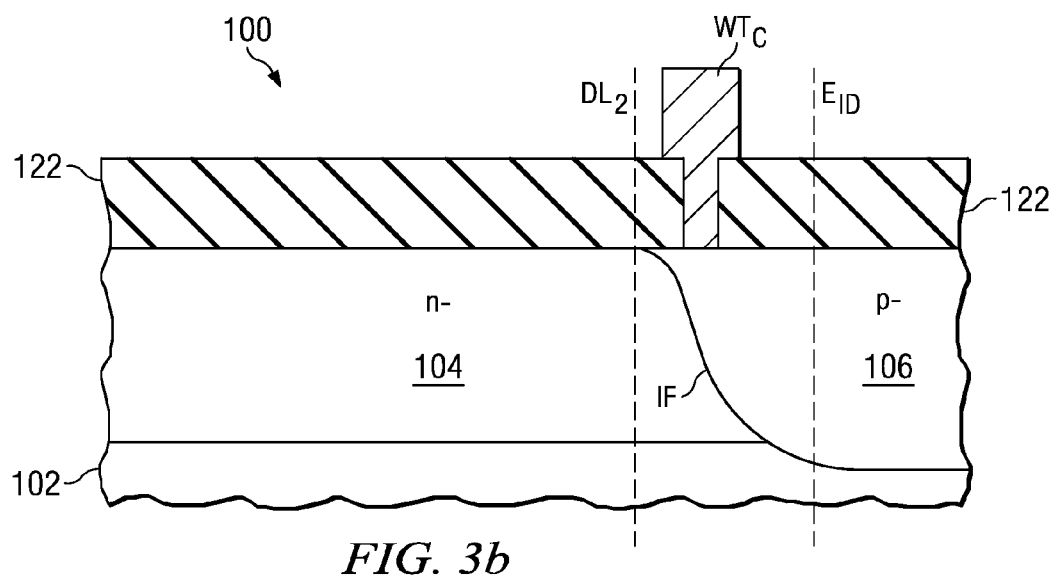
FIG. 3b illustrates a second cross-sectional view of a DEMOS transistor per a preferred embodiment, including a depiction of a novel well tap region therein.

FIG. 3a illustrates a plan view, and FIGS. 3b and 3c illustrate cross-sectional views, of a drain extended MOS ("DEMOS") transistor 100 according to a preferred embodiment. By way of introduction, the reader may compare FIG. 3c of the preferred embodiment with FIG. 2a of the prior art, from which it may be appreciated that in that cross-sectional view the devices may appear alike, although as shown later at other locations of the transistor (i.e., other cross-sections) additional structure is included per the preferred embodiment. Specifically, and as further detailed below, FIGS. 3a and 3b depict additional structure that facilitates a level of connectivity discussed later in connection with FIG. 4b in yet another aspect of the preferred inventive scope.

Turning first then to the preferred embodiment transistor 100 as shown in the cross-sectional view of FIG. 3c, it should be familiar as it relates to corresponding structure in FIG. 2a, detailed above. Also in this regard, therefore, the same steps used to create a prior art DEMOS transistor may be used to produce transistor 100 insofar as the devices are alike. Transistor 100 is shown by example as a p-channel DEMOS device, formed in connection with a preferably lightly-doped semiconductor substrate 102. This exemplary structure, as typical in the art for integrated circuits constructed according to complementary MOS (CMOS) technology, is formed according to a conventional twin-well process, in which an n-type well (or "n-well") region 104 and a p-type well (or "p-well") region 106 are formed at the surface of substrate 102. Both in the illustrated location and elsewhere in the integrated circuit, wells 104 and 106 serve as the body region for p-channel MOS and n-channel MOS transistors, respectively, and as such are typically relatively lightly doped. For example, doping concentrations for lightly doped regions in this document may be in the range of $1(10)^{15}/cm^3$ to $5(10)^{17}/cm^3$. Field oxide structures 108a and 108b are formed, by local oxidation of silicon (LOCOS) or by deposition and etching, at those locations of the surface of wells 104 and 106 that are to isolate conductive regions from one another. Doped regions, while not shown, may be disposed beneath field oxide structures 108a and 108b by the well-known "channel stop" ion implant to enhance the isolation provided by field oxide regions 108a and 108b.

Looking now to the active portions of DEMOS transistor 100, they are preferably formed by self-aligned ion implantation at the surface of wells 104 and 106. In this example, a gate electrode 110 is a patterned layer of polysilicon, metal, silicide-clad polysilicon, or another known conductive material suitable for use as a transistor gate, and it is disposed over a gate oxide layer 112. Sidewall insulating filaments 114 may be disposed along the edges of gate electrode 110. A source region 116 is a heavily-doped p-type region that is formed by ion implantation in a self-aligned manner relative to gate electrode 110 and field oxide structure 108a at the surface of n-well 104. A drain region 118 is a heavily doped p-type region formed by ion implantation into the surface of p-well 106, self-aligned relative to field oxide structure 108b, preferably using the same implant or implants as used to form source region 116. By way of example, the doping concentrations for such highly doped regions in this document may be in the range of $5(10)^{18}/cm^3$ to $1(10)^{20}/cm^3$. Similarly, a backgate contact region 120 is a heavily-doped n-type region formed at a selected location of n-well 104, by way of ion implantation into a selected location of the surface that well and self-aligned relative to field oxide structure 108a.

Completing the structures shown in FIG. 3c, an overlying insulator layer 122 is disposed over all of the underlying structures, including gate electrode 110, field oxide structures 108a and 108b and source, drain, and backgate contact regions 116, 118, and 120, respectively. Conductors $S_C$ ("source"), $D_C$ ("drain"), and $BG_C$ ("backgate") are formed to contact and provide electrical communication with source, drain, and backgate contact regions 116, 118, and 120, respectively. To form these conductors, contact openings are etched through insulator layer 122 at selected locations, and metal is then located in the openings and etched in the conventional manner to form the resultant conductors.

Given the likeness of the perspectives of FIGS. 3c and 2a and the earlier discussion of the latter, then also in transistor 100 a drift region DFT occurs from an interface IF between n-well 104 and p-well 106 and toward drain region 118. Moreover, when transistor 100 is turned off, such as by a voltage of $V_{dd}$ at both source region 116 and gate conductor 110, then a voltage gradient GR, shown by a dashed arrow, is created in p-well 106 whereby a higher voltage from source region 116 is located near interface IF and that voltage diminishes in the direction toward drain region 118. It is observed, however, in connection with the present inventive scope that additional structure and functionality may be made with respect to gradient GR, as is further demonstrated below in connection with FIGS. 3a and 3b.

FIG. 3b illustrates a cross-sectional view of transistor 100 from a different line across the plan view of FIG. 3a as compared to FIG. 3c, and in doing so it illustrates additional structure of the preferred embodiment. First in FIG. 3b, it may be appreciated that once again n-well 104 and p-well 106 are shown relative to substrate 102. In addition, however, a well tap conductor $WT_C$ is formed, preferably at the same time and with the same process, although at a different location, as are source, drain, and backgate conductors $S_C$, $D_C$, and $BG_C$; thus, a contact opening is etched through insulator layer 122 at a selected location above p-well 106, and metal is then located in the opening and etched in the conventional manner to form the resultant conductor so that it extends through insulator layer 122 and makes direct contact to p-well 106. Thus, well tap conductor $WT_C$ is so named because it allows electrical communication to the underlying p-well 106 that it contacts.

Given the additional structure of FIG. 3b, attention is now directed to the preferred location of well tap conductor $WT_C$. Specifically, and for reasons detailed below, note that well tap conductor $WT_C$ is preferably overlying the same p-well 106 as is drain region 118 (see FIG. 3c, below), and between interface IF and drain region 118, which may be appreciated by aligning the views of FIGS. 3b and 3c; in this regard, first looking to FIG. 3c, both interface IF and an edge $E_{ID}$ are shown, where the latter is the edge of drain region 118 that is closest to transistor gate conductor 110. In that illustration, note then that an area exists (and which is demonstrated in the y-axis direction of FIG. 3a) between source region 116 and drain region 118 and, more particularly, between interface IF and edge $E_{ID}$. Looking next to FIG. 3b, interface IF is again illustrated, and for sake of demonstration edge $E_{ID}$ is shown by a dashed line since its corresponding drain region 118 is not visible at the cross-section location depicted by FIG. 3b—however, one skilled in the art may readily align FIGS. 3b and 3c to appreciate that edge $E_{ID}$ in FIG. 3b corresponds to the same lateral location as it does in FIG. 3c. Given these alignments, note then in FIG. 3b that well tap conductor $WT_C$ preferably is located between interface IF and edge $E_{ID}$, which by definition thus places well tap conductor $WT_C$ closer to interface IF than drain region 118. This location of well tap conductor $WT_C$ is also appreciated in the plan perspective of FIG. 3a. Note that a dashed line $DL_2$ illustrates in all of FIGS. 3a through 3c the location where interface IF terminates beneath gate insulator 112. Thus, in FIG. 3a, in the lateral dimension between dashed line $DL_2$ and edge $E_{ID}$, which is also the dimension between well region 104 and drain region 118 of transistor 100, is located well tap conductor $WT_C$; that is, well tap conductor $WT_C$ is located in that dimension and between edge $E_{ID}$ and the termination line $DL_2$ of interface IF. Given these demonstrations with respect to the location of well tap well tap conductor $WT_C$ in FIGS. 3a through 3c, the precise lateral location in this regard may be selected by one skilled in the art based on the remaining discussion below.

The operation of transistor 100 is now explored, with additional attention directed to the aspects provided by well tap conductor $WT_C$. Toward this end, the following discussion first discusses the instance when transistor 100 is enabled and is then followed by a discussion of when it is disabled.

Transistor 100 is turned on by the application of a negative gate-to-source voltage, such as in the instance where: (i) $V_{dd}$ is applied to source conductor $S_C$ and its corresponding source region 116; and (ii) a voltage lower than $V_{dd}$ (e.g., ground) is applied to gate conductor $G_C$ (see FIG. 3a) and its corresponding gate electrode 110. In this instance, the majority carrier holes for the PMOS device are attracted to and thereby create an inversion channel in the n-type material of n-well 104 under gate oxide 112, where also the holes conduct from source region 116 toward the lower voltage at drain region 118 along the inversion channel. Upon reaching interface IF and p-well 106, the inversion channel is no longer present, but the holes continue to drift in drift region DFT toward drain region 118. Given the preceding, the potential of $V_{dd}$ is communicated from source conductor $S_C$ to n-well 104, through p-well 106, to drain conductor $D_C$. Note, therefore, that this voltage of $V_{dd}$ exists at this time in p-well 106 and, thus, at that time is also present at well tap conductor $WT_C$.

Transistor 100 is turned off by the application of a zero or positive gate-to-source voltage, such as in the instance where: (i) $V_{dd}$ is applied to gate conductor $G_C$ (see FIG. 3a) and its corresponding gate electrode 110; and (ii) $V_{dd}$ is also applied to source conductor $S_C$ and its corresponding source region 116, thereby yielding a zero gate-to-source voltage. In this instance, the low gate voltage repels the p-type majority carrier holes away from the channel area beneath gate oxide 112 and a depletion region (i.e., depleted of majority carriers) is formed in that area, thereby preventing conduction between the source and drain of the device. At this same time, the $V_{dd}$ potential, minus any drop across the pn interface between source region 116 and n-well 104, reaches interface IF. However, the lightly doped p-type material of p-well 106 provides resistance to that voltage and, thus, as noted earlier gradient GR is created whereby the voltage reduces in the direction from interface IF toward drain region 118. Given these observations, and since well tap conductor $WT_C$ is closer to interface IF than is drain region 118, then note then that the voltage at the location of well tap conductor $WT_C$ is between that at source region 116 and that at drain region 118, where in the present example the voltage at well tap conductor $WT_C$ is less than that in n-well 104 and greater than that at drain region 118. The amount of this reduction will be determined based on the proximity of well tap conductor $WT_C$ to dashed line $DL_2$ (and interface IF) as compared to the farther distance of drain region 118 (i.e., and its edge $E_{ID}$) to dashed line $DL_2$ (and interface IF).

By way of example to further illustrate the voltage at voltage tap conductor $WT_C$ when transistor 100 is turned off, assume that well tap conductor $WT_C$ is positioned relative to dashed line $DL_2$ so that there is a 5 volt drop from interface IF to that position as a result of gradient GR, and assume further that Vdd at source region 116 in the present example is 50 volts and that drain region 118 is connected to ground. Accordingly, when transistor 100 is disabled, then the voltage of Vdd from source region 116 (or Vdd minus the pn drop between source region 116 and n-well 104) reaches interface IF, but then in this example that voltage drops 5 volts from interface IF to the location of well tap conductor $WT_C$ such that a voltage of approximately 45 volts (i.e., Vdd−drop=50−5=45) is provided to well tap conductor $WT_C$. Accordingly, per the preferred embodiment, well tap conductor $WT_C$ may be strategically located for this very reason, that is, to provide a well tap voltage that is reduced from Vdd but is greater than the drain voltage (which in the present example is ground) when transistor 100 is disabled, and that voltage may be connected by way of well tap conductor $WT_C$ to another device, as is shown by way of example in FIG. 4b, below.

For sake of later discussion and to establish a convention, FIG. 4a illustrates a schematic of the DEMOS transistor 100 from FIGS. 3a through 3c given that a new device has been created and the FIG. 4a schematic facilitates the later illustration and discussion with respect to FIG. 4b. In FIG. 4a, transistor 100 includes the same convention as is known in the art for source, drain, and gate and, thus, the corresponding source conductor $S_C$, drain conductor $D_C$, and gate conductor $G_C$ from FIG. 3a are also shown in FIG. 4a. In addition, however, to depict the additional connectivity provided by well tap conductor $WT_C$, FIG. 4a illustrates an electrical connection that is shown to suggest a connection to the area in the transistor channel, just as the actual location of the connection of well tap conductor $WT_C$ electrically connects to the same p-well 106 that is contacted by drain region 118.

Thus, as explained above, when transistor 100 is enabled, its source voltage is coupled to well tap conductor $WT_C$, whereas when transistor 100 is disabled, then an intermediate voltage, between its source and drain voltage, is provided to well tap conductor $WT_C$, where that intermediate voltage occurs due to the impact of no conductivity from source to drain and the location of well tap conductor $WT_C$ relative to interface IF.

FIG. 4b illustrates a schematic of a drive circuit 200 according to a preferred embodiment and that implements mixed technology yet, as explained below, may avoid using a dual gate oxide process that would otherwise require different transistors having different gate oxide thicknesses. Looking to circuit 200 in detail, it includes a gate drive stage 210 and an inverter stage 230. Each of these stages is described below.

Gate drive stage 210 includes a p-channel transistor 212 and a p-channel transistor 214, where each of these transistors is preferably constructed as a DEMOS transistor having a well tap per the above-described preferred embodiment and, thus, may be constructed in the form of transistor 100 described earlier. The source of both p-channel transistors 212 and 214 is connected to a first voltage potential $V_{dd}$, where as used earlier in the Background Of The Invention section of this document the value of $V_{dd}$ is that from the analog portion of the mixed technology system and, thus, may be quite high as compared to the voltage supply of the digital core, referred to herein as $V_{DDC}$. The drain of p-channel transistor 212 is connected to a node $215_{N1}$, and the drain of p-channel transistor 214 is connected to a node $215_{N2}$. The gate of p-channel transistor 214 is connected to well tap conductor $WT_C$ of p-channel transistor 212, and the gate of p-channel transistor 212 is connected to well tap conductor $WT_C$ of p-channel transistor 214. Node $215_{N1}$ is also connected to the drain of an n-channel transistor 216, and the source of n-channel transistor 216 is connected to a second potential, lower than $V_{dd}$, and which in this example is ground; thus, looking to the conductive path of p-channel transistor 212 as coupled to the conductive path of n-channel transistor 216, the two are biased between bias voltages of $V_{dd}$ and ground. Comparably, node $215_{N2}$ is connected to the drain of an n-channel transistor 218, and the source of n-channel transistor 218 is connected to the second potential (e.g., ground); similarly, therefore, looking to the conductive path of p-channel transistor 214 as coupled to the conductive path of n-channel transistor 218, the two are biased between bias voltages of $V_{dd}$ and ground. N-channel transistors 216 and 218 may be constructed in various manners whether conventional or otherwise ascertainable by one skilled in the art. In the illustrated preferred embodiment, note that the gate oxides of the n-channel transistors 216 and 218 may be formed at the same time, and as of the same thickness, as that of the p-channel transistors 212 and 214; thus, in such a preferred embodiment, there is no need for the additional steps and complexity required to provide different gate oxides for different transistors. A low side drive logic block 220 provides a signal to an input node 222 which is connected to the gate of n-channel transistor 216 and to the input of an inverter 224, and as demonstrated below the signal so provided by logic block 220 is either $V_{DDC}$ or ground. Note, therefore, that block 220 provides an input voltage to the entire circuit and that voltage in its two possible states has a difference between $V_{DDC}$ and ground, which is smaller than the bias voltage between $V_{dd}$ and ground that is applied to the conductive paths of p-channel transistor 212 and n-channel transistor 216 or p-channel transistor 214 and n-channel transistor 218. Lastly, inverter 224 similarly has rail voltages of ground and $V_{DDC}$ for reasons more clear below; further, the output of inverter 224 is connected to the gate of n-channel transistor 218.

Looking to inverter stage 230, it includes a p-channel transistor 232 and an n-channel transistor 234, both of which may be constructed in various manners whether conventional or otherwise ascertainable by one skilled in the art, where again the gate oxide thicknesses for these devices may match those of the p-channel transistors and n-channel transistors in gate drive stage 210. Thus, in a preferred embodiment, all the p-channel and all the n-channel transistors have the same gate oxide thickness, that is, the process as such requires only one gate oxide thickness to build all the transistors (including all p-channel and all n-channel). P-channel transistor 232 has its source connected to $V_{dd}$, its drain connected to an output node 236, and its gate connected to the node to which are connected the gate of p-channel transistor 212 and well tap conductor $WT_C$ of p-channel transistor 214. N-channel transistor 234 has its source connected to ground, its drain connected to output node 236, and its gate connected to input node 222. Thus, looking to the conductive path of p-channel transistor 232 as coupled to the conductive path of n-channel transistor 234, the two are biased between bias voltages of $V_{dd}$ and ground The general operation of drive circuit 200 is now described. In general, a data state at input node 222 causes a complementary data state at output node 236. To better appreciate this operation, a first example is provided where low side drive logic block 220 outputs a low potential (e.g., ground) and output 236 provides a corresponding output of $V_{dd}$, and then a second example is provided where low side drive logic block 220 outputs a high potential (e.g., $V_{DDC}$) and output 236 provides a corresponding output of ground. Each of these examples is discussed separately, below.

As a first example of operation of drive circuit 200, if a ground voltage is output by low side drive logic block 220 to input node 222, then n-channel transistor 216 is disabled, while inverter 224 outputs a voltage of $V_{DDC}$ because n-channel transistors 216, 218, and 234 may operate at the core voltage levels as are also provided by low side drive logic block 220. Thus, the voltage of $V_{DDC}$ output from inverter 224 is applied to the gate of n-channel transistor 218, thereby enabling it and thus connecting node $215_{N2}$ to ground, which thus grounds the drain of p-channel transistor 214 and recall p-channel transistor 214 takes the form of transistor 100. Accordingly, referring briefly back to FIGS. 3b and 3c, note that the ground at the preferred embodiment transistor drain thereby prevents that transistor from conducting through its channel and, thus, the transistor is disabled. Further, recall from the earlier discussion of transistor 100 that when it is disabled, a voltage gradient GR extends in its p-well 106 and from its interface IF toward its drain, with gradient GR being tapped at the location of well tap conductor $WT_C$. Using the earlier example, when well tap conductor $WT_C$ is positioned relative to interface IF so that there is a 5 volt drop from interface IF to that position and where $V_{dd}$=50 volts, then recall the resultant well tap region voltage is approximately 45 volts when the transistor is disabled. Returning then to FIG. 4b and applying this example to p-channel transistor 214 when it is disabled, then this 45 volts is connected from the transistor well tap conductor $WT_C$ to the gate of p-channel transistor 212. Recalling that the source of p-channel transistor 212 is connected to $V_{dd}$, then at this point p-channel transistor 212 is receiving a gate-to-source voltage of approximately −5 volts (i.e., gate voltage minus source voltage=45−50=−5 volts). As a result, p-channel transistor 212 is enabled in a complementary fashion to the disabled p-channel transistor 214.

Continuing with the present example with respect to drive circuit 200, a particular benefit of the preferred embodiment is noted in connection with the operation thus described. Specifically, note that p-channel transistor 212 is enabled by receiving a gate voltage of approximately 45 volts, which therefore is relatively close to the $V_{dd}$ of 50 volts as compared to the enabling voltage in the prior art. Particularly, looking in contrast to the prior art depicted in FIG. 1, its p-channel transistor 22 is enabled by a gate voltage of 0 volts. In other words, therefore, the prior art p-channel transistor 22 has a gate that receives 0 volts to enable it and $V_{dd}$ volts (e.g., 50 volts) to disable it. Thus, as between being enabled and disabled, the prior art p-channel transistor experiences a considerable voltage swing of 50 volts, and that swing necessitates its relatively thick gate oxide so as to avoid a breakdown along that oxide. In contrast, the preferred embodiment as illustrated by example in FIG. 4b has a p-channel transistor 212 that receives approximately 45 volts to enable it, and as shown below it receives approximately 50 volts to disable it. Thus, as between being enabled and disabled, the preferred embodiment p-channel transistor experiences a relatively lower voltage swing of only 5 volts. As a result, it may be implemented with a thinner gate oxide than its prior art counterpart, thereby improving the complexity, cost, and related factors of the fabrication methodology.

Continuing then with the first example wherein in drive circuit 200 low side drive logic block 220 outputs a low signal to input node 222, note that the well tap voltage (e.g., 45 volts) that is reduced from $V_{dd}$ and at well tap conductor $W_{TC}$ of p-channel transistor 214 is also connected to the gate of p-channel transistor 232 of inverter stage 230. Thus, like p-channel transistor 212, p-channel transistor 232 has a negative gate-to-source voltage and is also enabled. Another similarity between these two p-channel transistors 212 and 232 is again a relatively smaller voltage swing is realized between enabling and disabling p-channel transistor 232. Specifically, looking in contrast to the prior art depicted in FIG. 1, p-channel transistor 42 is enabled by a gate voltage of 0 volts and it is disabled by $V_{dd}$ volts (e.g., 50 volts), meaning as between being enabled and disabled, the prior art p-channel transistor 42 experiences a considerable voltage swing of 50 volts, and that swing necessitates its relatively thick gate oxide so as to avoid a breakdown along that oxide. In contrast, the preferred embodiment as illustrated by example in FIG. 4b has a p-channel transistor 232 that receives at its gate approximately 45 volts to enable it, and as shown below the gate receives approximately 50 volts to disable it. Thus, as between being enabled and disabled, the preferred embodiment p-channel transistor 232 also experiences a relatively lower voltage swing of only 5 volts. As a result, it too may be implemented with a thinner gate oxide than its prior art counterpart and that may be as thin as the gate oxide of n-channel transistors 216, 218, and 234, thereby improving the complexity, cost, and related factors of the fabrication methodology. Finally, completing the first example, at the same time that p-channel transistor 232 is enabled, the low output at node 222 from low side drive logic block 220 disables n-channel transistor 234. Thus, in this example, the enabled p-channel transistor 232 conducts $V_{dd}$ from its source to output node 236, thereby providing a logic high output for drive circuit 200.

As a second example of operation of drive circuit 200, if a voltage of $V_{DDC}$ is output by low side drive logic block 220 to input node 222, then an operation complementary to that described in the first example above occurs. Thus, the reader may refer to the preceding discussion for additional complementary details, and a lesser discussion is needed for the present example. Looking then to this second example, the voltage of $V_{DDC}$ at input node 222 enables n-channel transistor 216 and n-channel transistor 234, and that same voltage after inversion to ground by inverter 224 disables n-channel transistor 218. Enabled n-channel transistor 216 grounds the drain of p-channel transistor 212, which is disabled. With p-channel transistor 212 disabled, its source voltage of $V_{DDC}$ is dropped across the gradient of its p-well and a voltage (e.g., 45 volts) less than $V_{DDC}$, but greater than its drain voltage of ground, is provided at its well tap conductor $WT_C$. This same well tap voltage (e.g., 45 volts) is connected to the gate of p-channel transistor 214, thereby causing it to have a negative gate-to-source voltage (i.e., −5 volts) due to the $V_{dd}$ volts (e.g., 50 volts) at its source. Consequently, p-channel transistor 214 is enabled and thus conducts $V_{dd}$ to its drain and also to its well tap conductor $WT_C$. The well tap conductor $WT_C$ of p-channel transistor 214 connects the voltage of $V_{dd}$ to the gate of p-channel transistor 232 of inverter stage 230, thereby disabling it, and similarly that same well tap conductor $WT_C$ of p-channel transistor 214 connects the voltage of $V_{dd}$ to the gate of p-channel transistor 212, further ensuring it too is disabled. Looking then at inverter stage 230, since its n-channel transistor 234 is enabled and its p-channel transistor 232 is disabled, the ground potential at the source of n-channel transistor 234 is provided to output node 236. Accordingly, in this example, the operation is demonstrated that for a voltage of $V_{DDC}$ output by low side drive logic block 220, a resultant low signal is provided at output node 236.

From the above, it may be appreciated that the preferred embodiments provide a drive circuit and a DEMOS transistor for use in that circuit. While the drain extended circuit has been shown in one configuration, various alternatives may be ascertained by one skilled in the art wherein the preferred embodiment DEMOS transistor may be implemented. Indeed, the present invention contemplates that the preferred embodiment DEMOS transistor may be used to provide a signal to the gate of another transistor in various different configuration. In addition, while the preferred embodiment DEMOS transistor has been, shown, it too may be modified in various manners. For example, certain of the process parameters described herein may be adjusted by one skilled in the art, steps may be added or re-arranged in order, and substitutions in some materials and structure also may be made. Further, while a preferred embodiment transistor has been shown as a p-channel transistor, in an alternative preferred embodiment the inventive aspects described herein may be implemented in an n-channel transistor as well. Given the preceding, therefore, one skilled in the art should further appreciate that while the present embodiments have been described in detail, various substitutions, modifications or alterations could be made to the descriptions set forth above without departing from the inventive scope, as is defined by the following claims.

What is claimed is:

1. A method of forming a drain extended transistor, comprising:
    forming a first well region of a first n-type or p-type conductivity;
    forming a second well region of second n-type or p-type conductivity, opposite to the first conductivity type;
    forming a source region of the second conductivity type in the first well region;
    forming a drain region of the second conductivity type in the second well region;

forming a gate oxide layer over portions of the first and second well regions;

forming a gate electrode over the gate oxide layer; and forming a well tap in contact with the second well region at a position laterally located between the drain region and an interface of the first and second well regions;

whereby, when the transistor is biased into an off state, a voltage at the well tap will be determined by the location of the well tap relative to a voltage gradient created in the second well region between the drain region and the interface.

2. The method of claim 1, further comprising:

forming a backgate contact region of the second conductivity type in the first well region;

forming an insulator layer over the source region, drain region, gate electrode, and backgate contact region; and forming conductors through the insulator layer to contact the source region, drain region, gate electrode and backgate region, respectively;

wherein the well tap comprises a conductor formed through the insulator layer and into contact with the second well region.

3. The method of claim 2, further comprising forming a first field oxide structure on a surface of the first well region, between the source region and the backgate contact region; and forming a second field oxide structure formed on a surface of the second well region, between the gate electrode and the drain region.

4. The method of claim 3, wherein the first conductivity type is n-type conductivity and the second conductivity type is p-type conductivity.

5. The method of claim 1, wherein the first conductivity type is n-type conductivity and the second conductivity type is p-type conductivity.

6. The method of claim 1, wherein the transistor is configured to turn on by application of a first gate-to-source voltage to create an inversion in a channel area under the gate oxide layer to cause conduction between the source and drain regions, so that the well tap voltage matches a voltage at the source and drain regions; and is further configured to turn off by application of a second gate-to-source voltage to create a depletion region in the channel area, so that the well tap voltage is between the voltages at source and drain regions.

7. The method of claim 6, wherein the first conductivity type is n-type conductivity; the second conductivity type is p-type conductivity; the first gate-to-source voltage is a negative gate-to-source voltage; the second gate-to-source voltage is a zero or positive gate-to-source voltage; and, when the transistor is turned off, the well tap voltage will be less than that in the first well region and greater that that at the drain region.

8. A method of forming a drain extended transistor, comprising:

forming a first well region of a first n-type or p-type conductivity;

forming a second well region of second n-type or p-type conductivity, opposite to the first conductivity type;

forming a gate oxide layer over portions of the first and second well regions;

forming a gate electrode over the gate oxide layer;

forming a source region of the second conductivity type in the first well region;

forming a drain region of the second conductivity type in the second well region;

a drift region located in the second well region between the drain region and an interface of the second well region with the first well region; and forming a well tap in contact with the second well region at a position laterally located between the drain region and an interface of the first and second well regions;

whereby, when the transistor is enabled, a source voltage is coupled to the well tap; and, when the transistor is disabled, an intermediate voltage, between a source and a drain voltage, is applied to the well tap; the intermediate voltage being set based on the position of the well tap relative to the interface.

9. The method of claim 8, further comprising:

forming a backgate contact region of the second conductivity type in the first well region;

forming an insulator layer over the source region, drain region, gate electrode, and backgate contact region; and forming conductors through the insulator layer to contact the source region, drain region, gate electrode and backgate region, respectively;

wherein the well tap comprises a conductor formed through the insulator layer and into contact with the second well region.

10. The method of claim 9, further comprising forming a first field oxide structure on a surface of the first well region, between the source region and the backgate contact region; and forming a second field oxide structure on a surface of the second well region, between the gate electrode and the drain region.

11. The method of claim 10, wherein the first conductivity type is n type and the second conductivity type is p type.

12. A method of forming a drain extended transistor, comprising:

forming a first well region of a first n-type or p-type conductivity in a substrate;

forming a second well region of second n-type or p-type conductivity, opposite to the first conductivity type, in the substrate and having an interface with the first well region;

forming a source region of the second conductivity type in the first well region;

forming a drain region of the second conductivity type in the second well region, the drain region being laterally spaced by a drift region from the interface;

forming a gate oxide layer over portions of the first and second well regions;

forming a gate electrode over the gate oxide layer; and forming a well tap in contact with the second well region at a position laterally located between the drain region and the interface.

13. The method of claim 12, wherein forming the well tap includes forming a well tap conductor through an insulating layer into contact with the second well region; and further comprising forming source and drain conductors through the insulating layer into respective contact with the source and drain regions.

14. The method of claim 13, wherein the well tap, source and drain conductors are formed at a same time and with a same process.

15. The method of claim 14, further comprising forming a backgate contact region of the second conductivity type in the first well region; and forming a backgate conductor through the insulating layer into contact with the backgate contact region at the same time and with the same process.

* * * * *